US008354334B2

United States Patent
Lee

(10) Patent No.: US 8,354,334 B2
(45) Date of Patent: Jan. 15, 2013

(54) POWER SEMICONDUCTOR CHIP WITH A FORMED PATTERNED THICK METALLIZATION ATOP

(75) Inventor: Il Kwan Lee, San Ramon, CA (US)

(73) Assignee: Alpha & Omega Semiconductor Inc., Sunnyvale, CA (US)

( * ) Notice: Subject to any disclaimer, the term of this patent is extended or adjusted under 35 U.S.C. 154(b) by 0 days.

(21) Appl. No.: 13/279,094

(22) Filed: Oct. 21, 2011

(65) Prior Publication Data

US 2012/0037981 A1    Feb. 16, 2012

Related U.S. Application Data

(63) Continuation of application No. 12/356,077, filed on Jan. 20, 2009, now Pat. No. 8,067,304.

(51) Int. Cl.
*H01L 21/20* (2006.01)
(52) U.S. Cl. ........ 438/584; 438/652; 438/654; 438/655; 438/688; 257/330; 257/331; 257/341; 257/E21.582
(58) Field of Classification Search ........................ None
See application file for complete search history.

(56) References Cited

U.S. PATENT DOCUMENTS

| 5,532,179 A | * | 7/1996 | Chang et al. | ........... | 438/270 |
| 5,763,915 A | * | 6/1998 | Hshieh et al. | ........... | 257/330 |
| 6,159,846 A | * | 12/2000 | Yoo | ........................... | 438/652 |

* cited by examiner

*Primary Examiner* — Kyoung Lee
(74) *Attorney, Agent, or Firm* — Chein-Hwa Tsao; C H Emily LLC

(57) ABSTRACT

A method is disclosed for forming a patterned thick metallization atop a semiconductor chip wafer. The method includes fabricating a nearly complete semiconductor chip wafer ready for metallization; depositing a bottom metal layer of sub-thickness TK1 together with its built-in alignment mark using a hot metal process; depositing a top metal layer of sub-thickness TK2 using a cold metal process thus forming a stacked thick metallization of total thickness TK=TK1+TK2; then, use the built-in alignment mark as reference, patterning the stacked thick metallization. A patterned thick metallization is thus formed with the advantages of better metal step coverage owing to the superior step coverage nature of the hot metal process as compared to the cold metal process; and lower alignment error rate owing to the lower alignment signal noise nature of the cold metal process as compared to the hot metal process.

13 Claims, 6 Drawing Sheets

POWER SEMICONDUCTOR CHIP WITH A FORMED PATTERNED THICK METALLIZATION ATOP

CROSS REFERENCE TO RELATED APPLICATIONS

This application is a continuation application of a U.S. application entitled "Method for Forming a Patterned Thick Metallization atop a Power Semiconductor Chip" by Il Kwan Lee, with application Ser. No. 12/356,077, filing date of Jan. 20, 2009, now U.S. Pat. No. 8,067,304 hereinafter referred to as Ser. No. 12/356,077. The content of Ser. No. 12/356,077 is herein incorporated by reference for any and all purpose.

FIELD OF INVENTION

This invention relates generally to the field of power semiconductor chip fabrication. More specifically, the present invention is directed to a technique of fabricating thick metallization atop a power semiconductor chip wafer with high yield.

BACKGROUND OF THE INVENTION

Semiconductor power device is one of the major pillars supporting modern day electronics industry. As part of the ongoing trend due to ever increasing chip integration density with concomitant higher power handling ability, low power consumption and low cost, copper wire becomes attractive in replacement of gold wire and Aluminum wire for use in wire bonding as copper wire provides the most cost effective solution to achieve a same design goal of connection loss. The major technical difficulty is its hardness, which requires increasing metallization thickness on the power semiconductor chip to accommodate copper wire bonding. Metal thickness in the range of 3 μm-6 μm (1 μm=1×10$^{-6}$ meter) is usually required. Semiconductor power devices using traditional bonding wires use a single hot metal layer in the range from 1-3 micron to serve as both contact and bonding pad. Hot Al metal is used for its good step coverage to provide reliable contact within the contact holes as cold Al metal tends to cause voids within contact holes resulting in reliability failure. This is becoming more significant as the advance of technology improves the semiconductor area usage efficiency through the shrinkage of feature size. For example, the wall-to-wall pitch size of some of power MOSFETs in use today are in the order of 1 micron, leading to smaller contact holes dimension and tighten mask alignment tolerance. However the attribute of good step coverage of hot metal would degrade the sharpness of alignment mark for later masking process thus requiring larger tolerance margin while increasing the thickness of metal layer, leading to low semiconductor area usage efficiency. It is therefore desirable to develop new and improved approaches for deposition of thick metal layer in the range of 3-6 micron that would provide both reliable contact and effective alignment marks.

SUMMARY OF THE INVENTION

A method is disclosed for forming a patterned thick metallization atop a surface insulation layer of a semiconductor power chip. The semiconductor power chip top has numerous pre-patterned contact zones. The method includes the following steps:
a) Fabricate a nearly complete semiconductor chip wafer with built-in alignment marks ready for metallization.
b) On top of the wafer, deposit a bottom metal layer of sub-thickness TK1 using a hot metal process.
c) On top of the bottom metal layer, deposit a top metal layer of sub-thickness TK2 using a cold metal process thus forming a composite thick metallization of total thickness TK=TK1+TK2.
d) Using the built-in alignment mark as reference, pattern the composite thick metallization.

In this way, a patterned thick metallization is formed with the following process advantages:
1. Better metal step coverage owing to the superior metal step coverage nature of the hot metal process as compared to that of the cold metal process.
2. Lower alignment error rate owing to the lower alignment signal noise nature of the cold metal process as compared to that of the hot metal process.

In a more specific embodiment, the method further restricts the sub-thickness TK1 and the sub-thickness TK2 such that the total thickness TK does not exceed a pre-determined maximum total thickness TK$_{max}$ beyond which an unacceptable alignment error rate results owing to an excessive alignment signal noise of the composite thick metallization.

In a more specific embodiment, the method further selects the sub-thickness TK1 and the sub-thickness TK2 such that their ratio R=TK2/TK1 does not exceed a pre-determined maximum ratio R$_{max}$ beyond which an unacceptable metal step coverage results owing to an insufficient sub-thickness TK1.

In a more specific embodiment, the method further selects the sub-thickness TK1 and the sub-thickness TK2 such that their ratio R=TK2/TK1 does not fall below a pre-determined minimum ratio R$_{min}$ below which an unacceptable alignment error rate results owing to an excessive sub-thickness TK1.

In a more specific embodiment, deposit the bottom metal layer using a hot metal process further includes vacuum depositing a composition of (aluminum, silicon, copper) at a temperature exceeding 400 degree C. Correspondingly, the composition further includes, by weight percentage, Al of about 98~99%, Si of about 0.5~1.5% and Cu of about 0.1~1.0%.

In a more specific embodiment, deposit the top metal layer using a cold metal process further includes vacuum depositing a composition of (aluminum, copper) at a temperature of about 300±50 degree C. Correspondingly, the composition further includes, by weight percentage, Al of about 99.0~99.9% and Cu of about 0.1~1.0%.

In a more specific embodiment, TK$_{max}$ is 6.0 μm, R$_{max}$ is about 7:1 and R$_{min}$ is about 3:1.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1A:
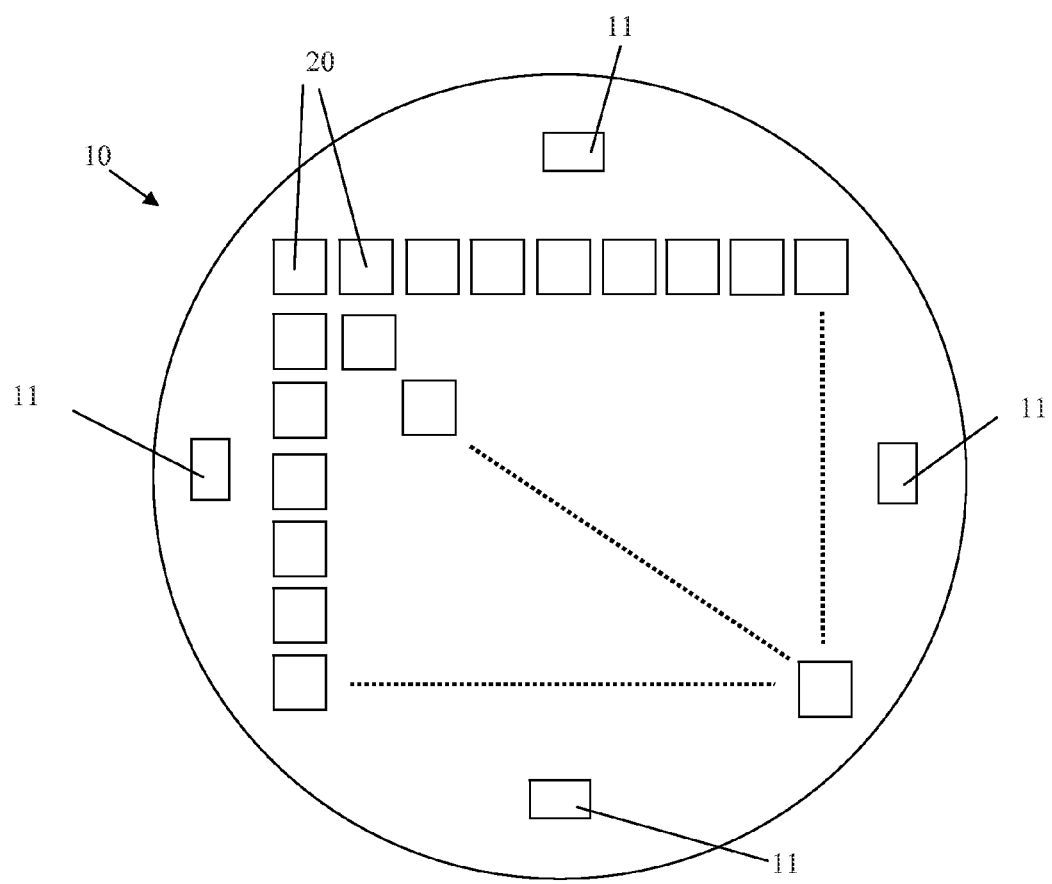
FIG. 1A illustrates the top view of a power MOSFET semiconductor wafer with built-in alignment marks.
Figure 1B:
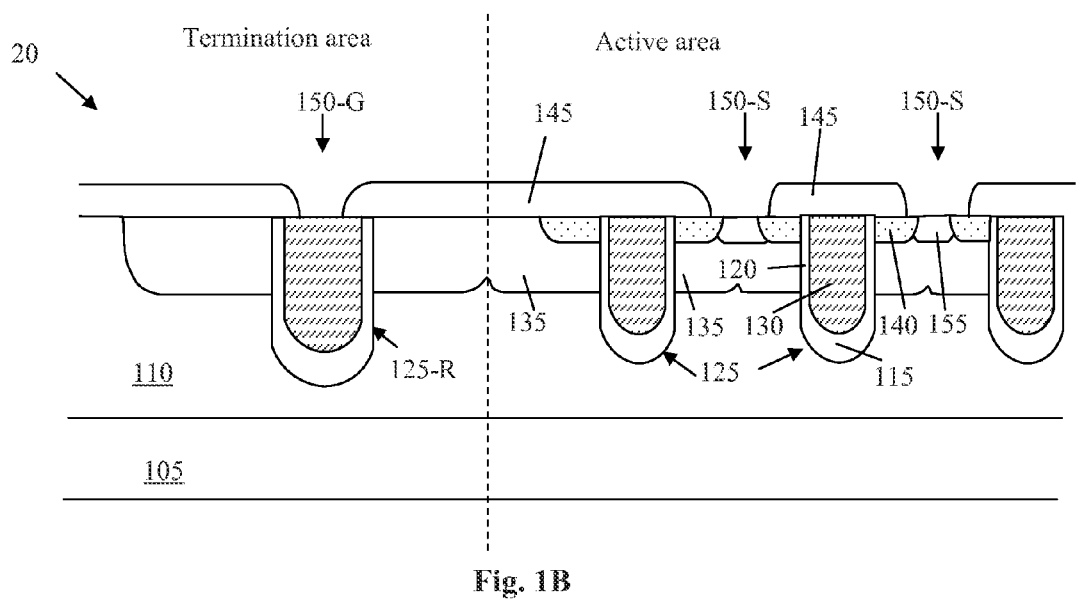
FIG. 1B illustrates a cross section of a portion of MOSFET chip before metallization.
Figure 1C:
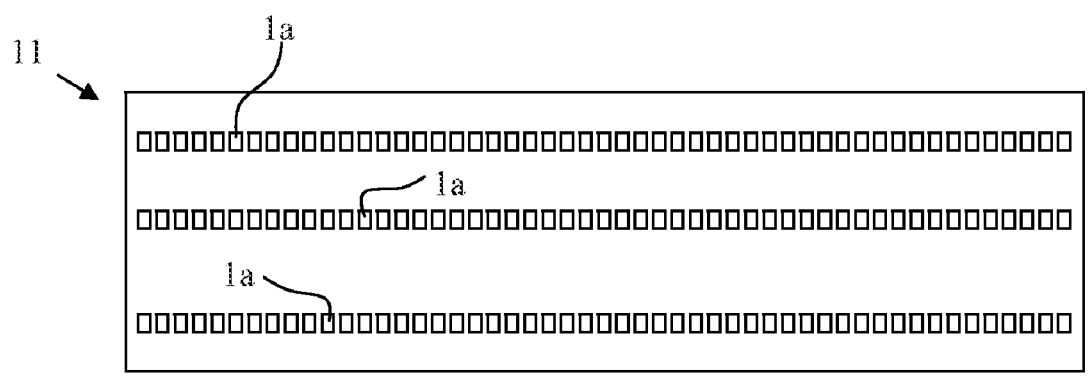
FIG. 1C is a top view of the built-in alignment marks of FIG. 1A.
Figure 1D:
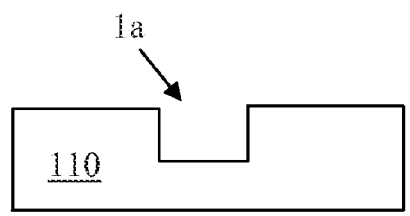
FIG. 1D is a cross section of a portion of built-in alignment mark of FIG. 1C.

FIG. 1A illustrates a typical layout of semiconductor wafer 10 ready for metallization comprising a plurality of trenched MOSFET chips 20 thereon each having a cross section view as shown in FIG. 1B. At four corners of wafer 10 there are alignment mark groups 11 for aligning masks to the wafer during manufacturing process. Each alignment mark groups 11 comprises multiple rows each having multiple 3 μm×4 μm trench boxes 1a as shown in FIG. 1C. FIG. 1D shows the cross section of a trench box 1a. The depth of the trench boxes 1a is about 1.0 μm-1.5 μm. Alternatively, the alignment mark can be other geometric shapes, such as a cross. Referring to FIG. 1B, MOSFET chip 20 comprises an active area having a plurality of trenches 125 filed with insulated gate material 130 extending into an epitaxial layer 110 overlaying a substrate layer 105 that functions as a drain. In one embodiment the insulated gate has a thicker insulation region 115 in the bottom of the trenches 125. In another embodiment the insulation region 115 has substantially the same thickness as the gate insulation layer 120 on the sidewalls of trenches 125. MOSFET chip 20 further comprises body regions 135 extending between trenches and source regions 140 disposed in body regions next to the trenches. Body contact implant regions 155 are disposed between the source regions 140. A dielectric layer 145 overlaying the semiconductor surface with source/body contact openings 150-S open through the dielectric layer 145 for providing metal contact to the source/body regions. In general, the dielectric layer 145 may have a thickness between 0.3-1.0 micron and the widths of contact openings may range from 0.15 to 0.5 micron. In one embodiment, the dielectric layer 145 is about 0.5 micron and the source/body contact opening is about 0.25 micron.

MOSFET chip 20 further comprises a termination area having a gate contact opening 150-G that is opened through dielectric layer 145 on top of a gate runner trench 125-R for providing metal contact to gate 130. In one embodiment the gate runner trench 125-R is wider and deeper than the gate trenches 125. In another embodiment the width of gate contact opening 150-G is narrower than the width of source/body contact openings 150-S. The gate trenches 125 and the gate runner trench 125-R are interconnected in a third dimension (not shown).

Figure 2A:
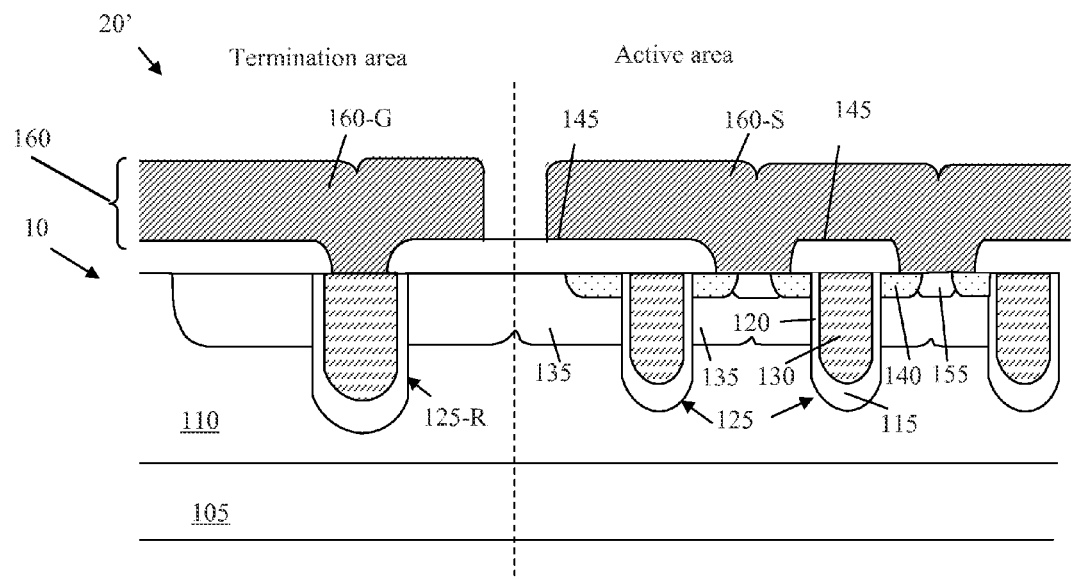
FIG. 2A illustrates the cross section of a portion of a MOSFET chip after one embodiment of thick metallization process to accommodate Cu wire bonding.

As illustrated in FIG. 2A a metal layer 160 is then deposited on top of the semiconductor wafer 10. The alignment marks 1a are also covered with metal during this metallization process. The metal covered alignment marks are used to align a mask to pattern metal layer 160 for separating the gate metal 160-G from source metal 160-S. To provide a bonding pad thick enough to accommodate Cu wire bonding, metal layer 160 is provided with a thickness between 3-6 micron, preferably between 4-5 micron. A combination of Type-I metallization and Type-II metallization may be used. The usage of the terminologies "type-I metallization" and "type-II metallization" is for the purpose of conveying that, in the art of semiconductor wafer processing, numerous types of material compositions are available for the metallization. Furthermore, for each material composition there is usually a preferred wafer processing parameter set for the associated deposition process. As specific examples the following are defined:

Type-I metallization: hot metal containing aluminum (Al), silicon (Si) and copper (Cu), with a vacuum deposition temperature at 400 degree C. or above. In one embodiment, the composition (Al, Si, Cu) contains, by weight percentage, Al of about 98~99%, Si of about 0.5~1.5% and Cu of about 0.1~1.0%. A preferred specific embodiment contains, by weight percentage, Al of about 98.5%, Si of about 1.0% and Cu of about 0.5%. It is remarked that, in the art, the minute dopant amount of Si is added in the hot metal to prevent Al spiking downward into the Si wafer.

Type-II metallization: cold metal containing aluminum (Al) and copper (Cu), with a vacuum deposition temperature of about 350 degree C. or below. In one embodiment, the composition of (Al, Cu) contains, by weight percentage, Al of about 99.0~99.9% and Cu of about 0.1~1.0%. A preferred specific embodiment contains, by weight percentage, Al of about 99.5% and Cu of about 0.5%.

Figure 2B:
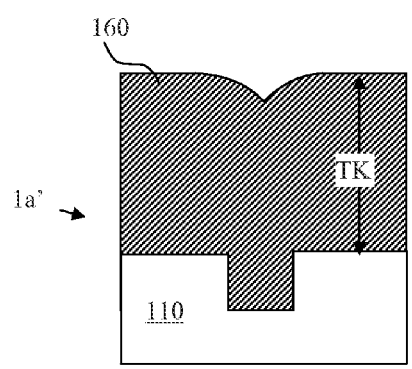
FIG. 2B illustrates a cross section of a portion of the built-in alignment marks of FIG. 1C after one embodiment of thick metallization process to accommodate Cu wire bonding.

In one embodiment, a Type-I hot Al metal layer with thickness of 4 micron is deposited using CVD at a temperature exceeds 400 degree C. FIG. 2B shows the cross section of alignment mark 1a after the deposition of 4 micron Type-I metallization. As can be seen the metal layer 160 provides good step coverage. However, the thick metal layer 160 level off the step profile of the underlying alignment mark. Each individual mark distortion produces noisy alignment signal in masking alignment process due to lose of contrast ratio. Also, the grain boundary structure of Type-I metallization is such that light from an alignment mark detector cannot clearly see the alignment mark 1a' through the Type-I metal; the grain boundary structure of Type-II metallization is better suited for this task. The noisy alignment signal caused by poor contrast ratio of alignment mark resulting in 45.8% error rate using single reading methodology in the following contact metal mask etching process. This could reduce the yield of finished product as much as 20%. In order to maintain a good product yield, such high alignment error rate requires much larger mask alignment tolerance therefore greatly discounting the advantage provided by small feature size enabled by the advanced technologies.

Figure 3A:
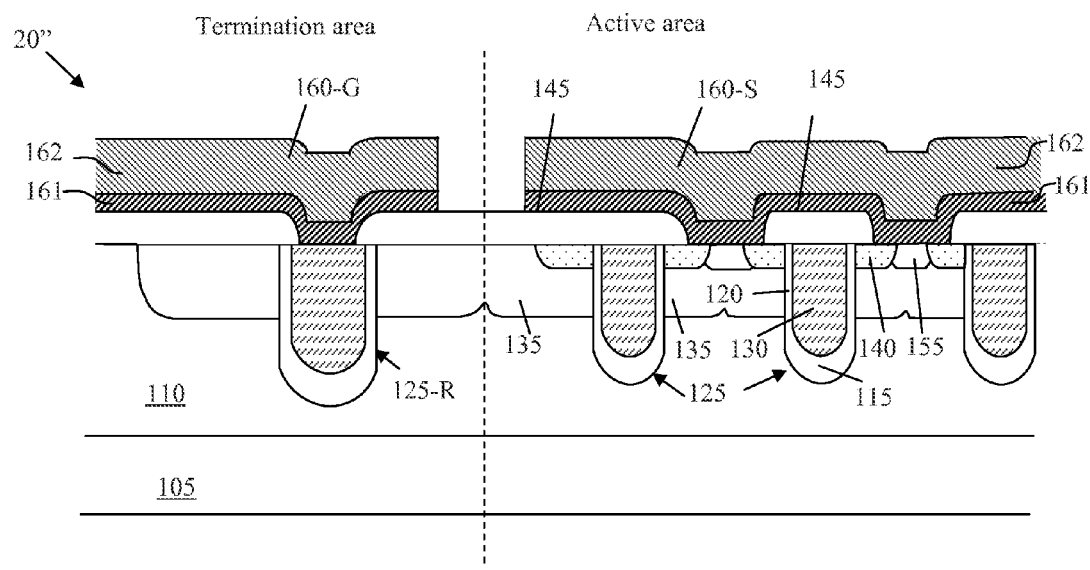
FIG. 3A illustrates the cross section of a portion of a MOSFET chip after another embodiment of thick metallization process to accommodate Cu wire bonding.
Figure 3B:
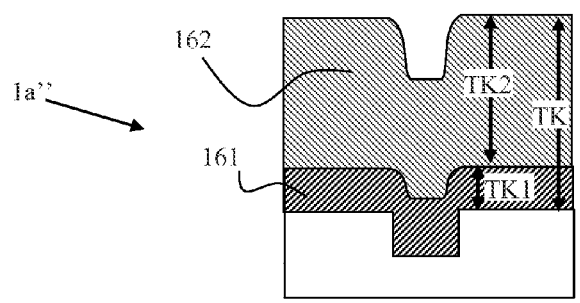
FIG. 3B illustrates a cross section of a portion of the built-in alignment marks of FIG. 1C after another embodiment of thick metallization process to accommodate Cu wire bonding.

In another embodiment, as shown in FIGS. 3A-3B, a combination of Type-I and Type-II metal deposition processes are used. Preferably a thin layer of Type-I (hot) metallization 161 is carried out followed by a thick layer of Type-II (cold) metallization 162. The selected thickness TK1 of the thin Type-I metallization 161 (hot metal) for illustration is about 0.5-1 μm and the selected thickness TK2 of the thin Type-II metallization 162 (cold metal) for illustration is about 3-4 μm. FIGS. 3A and 3B are the cross sections of MOSFET chip 20" and alignment mark 1a' after deposition of thin layer Type-I metallization and thick layer of Type-II metallization respectively. Comparing FIGS. 2A and 2B, with FIGS. 3A and 3B shows the combined metallization layer provides a top surface conforming to the underling profile while maintaining good contact to the semiconductor area. The step profile of alignment mark is cast onto the top surface with reasonably good contrast ratio to enable accurate mask alignment. Further the stepping structure on the top metal surface provides the benefit of cushion effect in wire bonding therefore reducing the impact of wire bonding.

As mentioned before, hot metal is known to produce superior metal step coverage than the cold metal at the metallization/semiconductor interface in that the hot metal shows less propensity toward formation of unacceptable voids in the metal near the interface. Hence, the bottom Type-I metallization layer must be thick enough to provide sufficient amount of hot metal so as to form a void-free metallization/semiconductor interface. However the alignment mark contrast ratio will degrade with the increase of Type-I metallization layer thickness. Test results show the thickness of Type-I metallization is preferably between 0.5-1 micron to provide a good contact to the semiconductor area without degrading the contrast ratio beyond the level of acceptance. Further to maintain a good metal alignment pass rate, the total thickness of combined Type-I and Type-II metallization layers should not exceed 6 micron, preferably not to exceed 5 micron. An associated empirical test, not described here in detail, has further determined that the ratio R=TK2/TK1 should not exceed a maximum ratio $R_{max}$ of about 7:1 beyond which an unacceptable metal step coverage results due to an insufficient hot metal thickness TK1, or not to fall below a minimum ratio $R_{min}$ of about 3:1 below which an unacceptable alignment error rate results owing to an excessive sub-thickness TK1. For example, combination of 0.5 micron Type-I followed by 3.5 micron Type-II and 1 micron of Type-I followed by 3 micron of Type-II both yield 4 micron combined thickness with very good contact and alignment pass rate.

Figure 4:
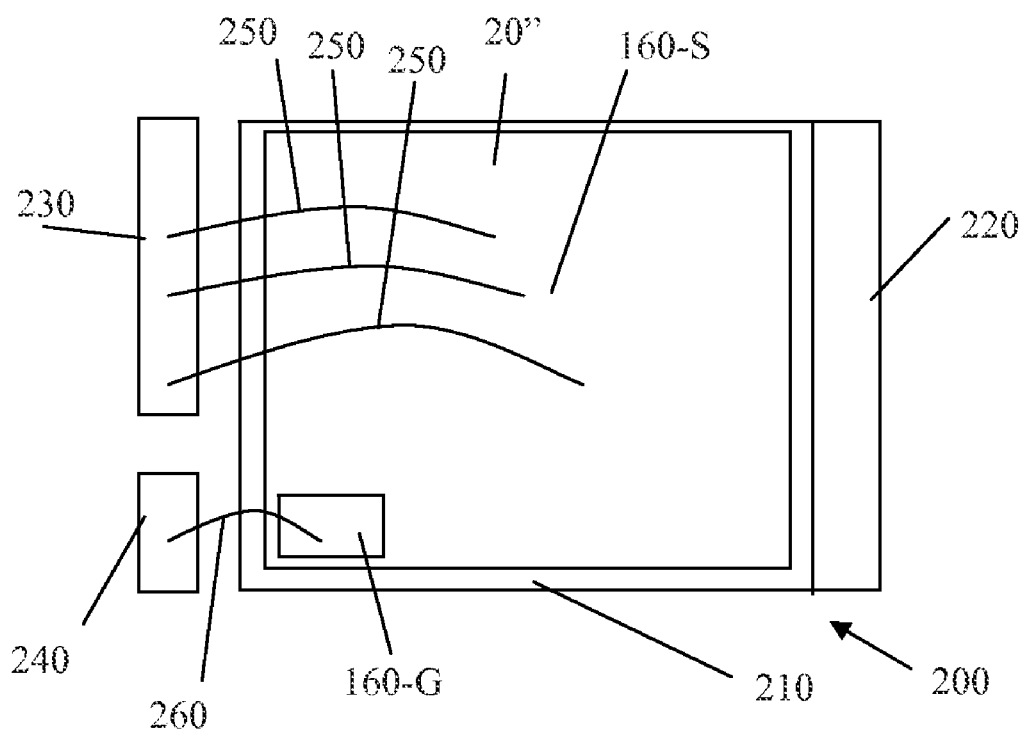
FIG. 4 illustrates a top view of MOSFET in package.

Semiconductor wafer 10 is then diced into individual chips 20" for packaging into individual devices after backside thinning and metallization. As shown in FIG. 4, chip 20" is disposed on a lead frame 200 with MOSFET drain connected to die pad 210 of lead frame 200. Lead frame 200 comprising a drain lead 220 connected to die pad 210 on one side and with a source lead 230 and a gate lead 240 on another side. Cu wires may be used to wire bond the source and gate of the chip 20" to the source lead 230 and the gate lead 240 on the lead frame 200. A plurality of Cu wires 250 are used as source wires for bonding to the source metallization layer 160-S on one end and to source leads 230 on the other end. In one embodiment a gate wire 260 bonding to the gate metallization layer 160-G on one end and to the gate lead 240 on the other end comprises Cu as well. In another embodiment the gate wire 260 comprises gold wire to minimize the gate wire diameter therefore the gate metallization 160-G can be minimized for further improvement of the semiconductor area usage efficiency.

A method has been described for forming a patterned stacked thick metallization atop a semiconductor wafer. The method includes the following steps:
a) Fabricate a nearly complete power semiconductor wafer ready for metallization.
b) On top of the wafer, deposit a bottom metal layer of thickness TK1 together with its built-in alignment mark using a hot metal process.
c) On top of the bottom metal layer, deposit a top metal layer of thickness TK2 using a cold metal process thus forming a composite thick metallization of total thickness TK=TK1+TK2.
d) Use the built-in alignment mark as reference, pattern the stacked thick metallization.

A patterned stacked thick metallization is thus formed with the following advantages:
Better metal step coverage owing to the superior metal step coverage nature of the hot metal process as compared to that of the cold metal process.
Lower alignment error rate owing to the lower alignment signal noise nature of the cold metal process as compared to that of the hot metal process.

While the description above contains many specificities, these specificities should not be constructed as accordingly limiting the scope of the present invention but as merely providing illustrations of numerous presently preferred embodiments of this invention. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. For example, the present invention methodology of using a stacked metallization structure to simultaneously leverage the numerous distinct advantages of the various metallic sub-layers is anticipated to be applicable to multi-layer stacks of numerous other metallic compositions and associated deposition steps as well. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

I claim:

1. A power semiconductor chip comprising:
an active area having a plurality of trenches filed with an insulated gate material extending into an epitaxial layer overlaying a substrate layer functioning as a drain;
body regions extending between trenches;
source regions disposed in body regions next to the trenches;
a dielectric layer overlaying the semiconductor surface with contact openings thereon; and
a metal layer overlaying the dielectric layer contacting the source regions through the contact openings, wherein said metal layer comprising a thin metallization layer in the bottom and a thick metallization layer on the top with the composition of said thin metallization layer comprises a Si content higher than the Si content of said thick metallization layer; and
wherein said metal layer has a combined thickness of 4-5 micron.

2. The power semiconductor chip of claim 1 wherein said thick metallization layer is free of Si.

3. The power semiconductor chip of claim 1 wherein said thin metallization layer has a thickness between 0.5 micron and 1 micron.

4. The power semiconductor chip of claim 1 wherein the ratio of thick metallization thickness to thin metallization thickness ranges from about 3:1 to about 7:1.

5. The power semiconductor chip of claim 1 wherein said metal layer has a top surface of step profile substantially conforming to the topography of its underlying dielectric layer.

6. The power semiconductor chip of claim 1 further comprising:
a termination area having a gate contact opening opened through the dielectric layer on top of a gate runner trench for providing metal contact to the insulated gate.

7. A power semiconductor chip comprising:
an active area having a plurality of trenches filed with an insulated gate material extending into an epitaxial layer overlaying a substrate layer functioning as a drain;
body regions extending between trenches;
source regions disposed in body regions next to the trenches;
a dielectric layer overlaying the semiconductor surface with contact openings thereon;
a metal layer overlaying the dielectric layer contacting the source regions through the contact openings, wherein said metal layer comprising a thin metallization layer in the bottom and a thick metallization layer on the top with the composition of said thin metallization layer comprises a Si content higher than the Si content of said thick metallization layer;
a termination area having a gate contact opening opened through the dielectric layer on top of a gate runner trench for providing metal contact to the insulated gate; and
a metal layer overlaying the dielectric layer contacting the insulated gate through the gate contact opening, and said metal layer further comprising a thin metallization layer at the bottom and a thick metallization layer on the top.

8. A power semiconductor chip comprising:
a power semiconductor chip with a plurality of contact zones;
a dielectric layer overlaying the semiconductor surface extending over said plurality of contact zones and having a plurality of contact openings thereon;
a metal layer overlaying the dielectric layer contacting a plurality of source regions through the contact openings, wherein said metal layer comprising a thin metallization layer in the bottom and a thick metallization layer on the top with a composition of said thin metallization layer different from a composition of said thick metallization layer, wherein the ratio of thick metallization thickness to thin metallization thickness ranges from about 3:1 to about 7:1; and
wherein said metal layer has a combined thickness of 4 to 5 micron.

9. The power semiconductor chip of claim 8 wherein said thin metallization layer comprises 0.51~5% of Si.

10. The power semiconductor chip of claim 8 wherein said thin metallization layer has a thickness between 0.5 micron and 1 micron.

11. The power semiconductor chip of claim 8 wherein said metal layer has a top surface of step profile substantially conforming to the topography of its underlying dielectric layer.

12. The power semiconductor chip of claim 8 further comprising:
a termination area having a gate contact opening opened through the dielectric layer on top of a gate runner trench for providing metal contact to insulated gate.

13. A power semiconductor chip comprising:
a power semiconductor chip with a plurality of contact zones;
a dielectric layer overlaying the semiconductor surface extending over said plurality of contact zones and having a plurality of contact openings thereon;
a metal layer overlaying the dielectric layer contacting a plurality of source regions through the contact openings, wherein said metal layer comprising a thin metallization layer in the bottom and a thick metallization layer on the top with a composition of said thin metallization layer different from a composition of said thick metallization layer, wherein the ratio of thick metallization thickness to thin metallization thickness ranges from about 3:1 to about 7:1;
a termination area having a gate contact opening opened through the dielectric layer on top of a gate runner trench for providing metal contact to insulated gate; and
a metal layer overlaying the dielectric layer contacting the insulated gate through the gate contact opening, and said metal layer further comprising a thin metallization layer at the bottom and a thick metallization layer on the top.

* * * * *